(12) United States Patent
Lunsman et al.

(10) Patent No.: US 10,827,649 B2
(45) Date of Patent: Nov. 3, 2020

(54) COOLING FLUIDS IN OPPOSITE DIRECTIONS ACROSS A DEVICE

(71) Applicant: HEWLETT PACKARD ENTERPRISE DEVELOPMENT LP, Houston, TX (US)

(72) Inventors: Harvey J. Lunsman, Chippewa Falls, WI (US); Ernesto Ferrer Medina, Aguadilla, PR (US); Tahir Cader, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/965,069

(22) Filed: Apr. 27, 2018

(65) Prior Publication Data
US 2019/0335618 A1    Oct. 31, 2019

(51) Int. Cl.
*H05K 7/20* (2006.01)
*G06F 1/20* (2006.01)

(52) U.S. Cl.
CPC ......... *H05K 7/20281* (2013.01); *G06F 1/206* (2013.01); *H05K 7/20254* (2013.01); *H05K 7/20927* (2013.01); *G06F 2200/201* (2013.01)

(58) Field of Classification Search
CPC .......... H05K 7/20281; H05K 7/20254; H05K 7/20927; G06F 1/206; G06F 2200/201; F28F 2250/104; F28F 2260/02
USPC ...................................... 165/80.3
See application file for complete search history.

(56) References Cited

U.S. PATENT DOCUMENTS

| | | | | |
|---|---|---|---|---|
| 3,481,393 A | * | 12/1969 | Chu | F28F 3/12 165/80.4 |
| 3,528,492 A | * | 9/1970 | Austin | H01Q 1/02 165/80.4 |
| 5,592,363 A | * | 1/1997 | Atarashi | H01L 23/467 165/185 |
| 5,983,997 A | * | 11/1999 | Hou | F28F 3/027 165/144 |
| 6,619,044 B2 | * | 9/2003 | Batchelor | F28F 1/045 62/259.2 |
| 6,675,875 B1 | * | 1/2004 | Vafai | H01L 23/473 165/168 |
| 8,289,710 B2 | | 10/2012 | Spearing et al. | |
| 8,422,218 B2 | | 4/2013 | Fried et al. | |
| 8,820,395 B2 | * | 9/2014 | Yatskov | F28D 1/0426 165/176 |

(Continued)

OTHER PUBLICATIONS

Mohamed M. Sabry, "Greencool; an Energy-efficient Liquid Cooling Design Technique for 3-D MPSoCs via Channel Width Modulation," IEEE Transactions on Computer-Aided Design of Integrated Circuits and Systems, Apr. 2013, pp. 524-537, vol. 32, No. 4, IEEE.

*Primary Examiner* — Tho V Duong
(74) *Attorney, Agent, or Firm* — Hewlett Packard Enterprise Patent Department

(57) ABSTRACT

Examples herein relate to an efficient cooling system. Examples disclose a first distribution line that delivers a first cooling fluid across a device. The first cooling fluid flows across the device from a first side to a second side. The examples also disclose a second distribution like that is separate from the first distribution line. The second distribution line delivers a second cooling fluid across the device from the second side to the first side such that the second cooling fluid flows in an opposite direction to the first cooling fluid.

19 Claims, 8 Drawing Sheets

(56) References Cited

U.S. PATENT DOCUMENTS

2011/0176273 A1* 7/2011 Olsen .................. G06F 1/20
  361/679.47
2017/0003039 A1 1/2017 Lazzari
2017/0186667 A1 6/2017 Choudhury et al.

* cited by examiner

Single Cold Plate Loop
Inlet Flow Depicted

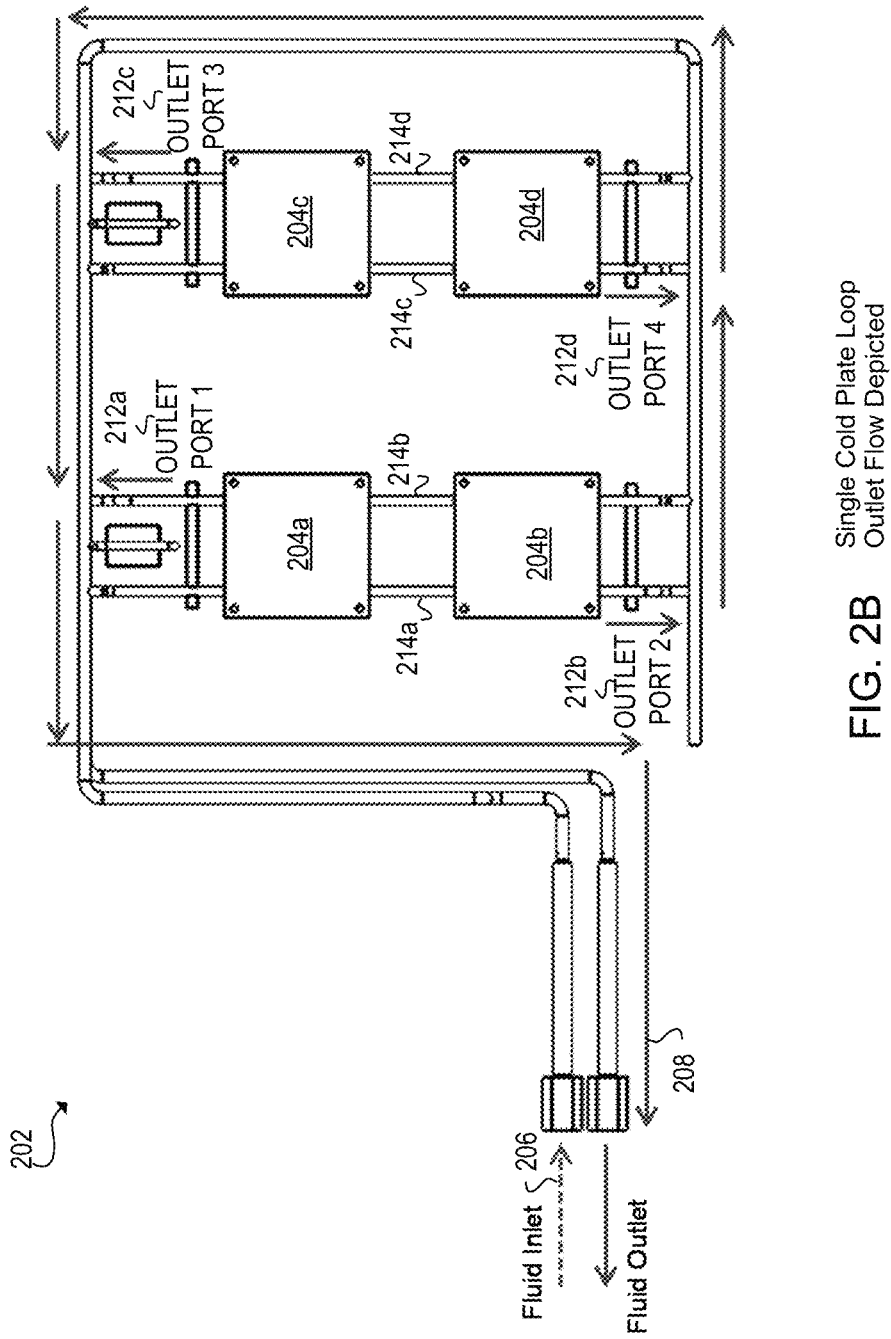
FIG. 2B  Single Cold Plate Loop
Outlet Flow Depicted

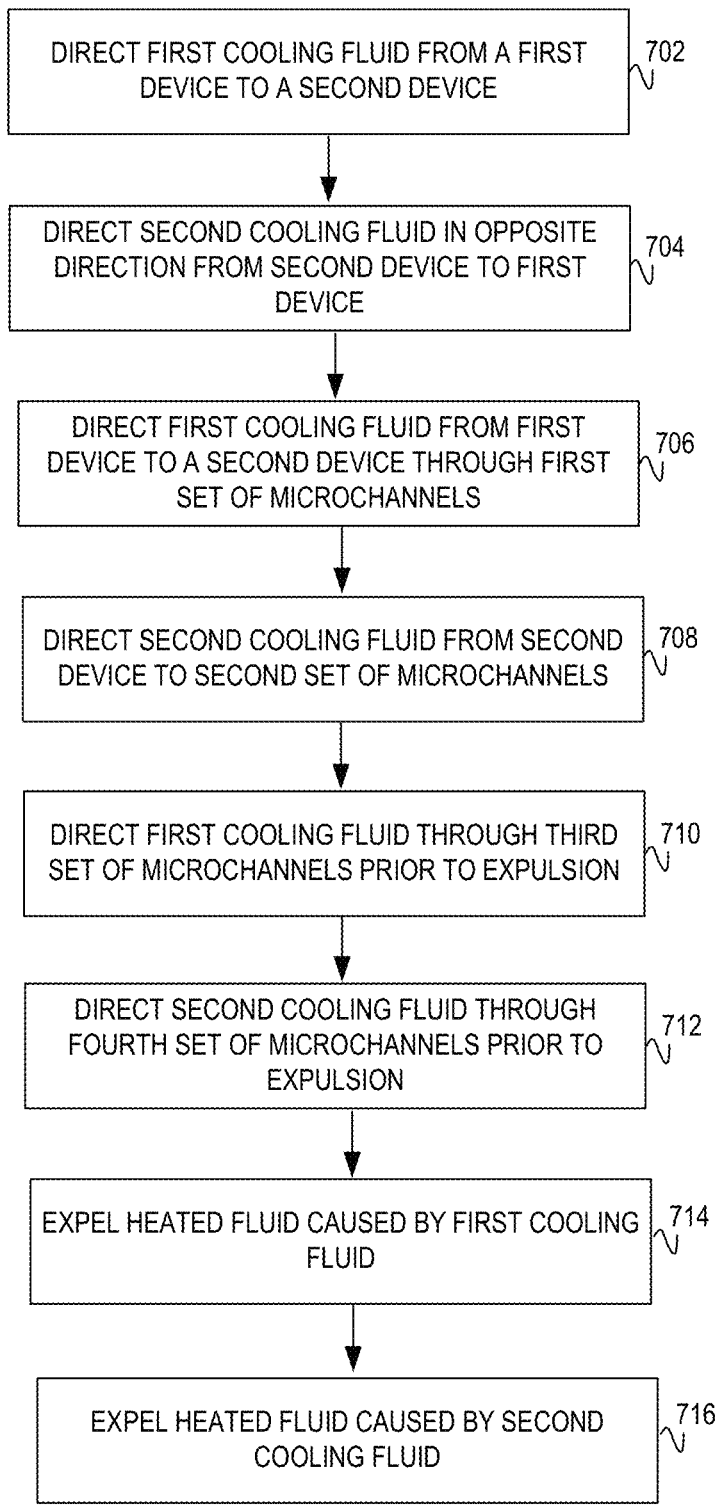

COOLING FLUIDS IN OPPOSITE DIRECTIONS ACROSS A DEVICE

BACKGROUND

With the increased amount of data, global demand has pushed the need for faster data processing. One such development to meet global demand is exascale computing that refers to computing systems capable of at least one exaFLOP or a billion calculations per second. Such capacity represents a thousandfold increase over previous computing systems.

BRIEF DESCRIPTION OF THE DRAWINGS

In the accompanying drawings, like numerals refer to like components or blocks. Various features of the present disclosure will be apparent from the detailed description which follows, taken in conjunction with the accompanying drawings, which together illustrate, by way of example, features of the present disclosure, and wherein:

FIG. 2B represents an example cooling system that includes an expulsion of cooling fluids that are delivered across multiple devices in accordance with the present disclosure;

FIG. 7 illustrates a flow diagram executable by a computing device to direct cooling fluids that flow in opposite directions though a respective set of microchannels prior to expulsion in accordance with the present disclosure.

DETAILED DESCRIPTION

Figure 1:
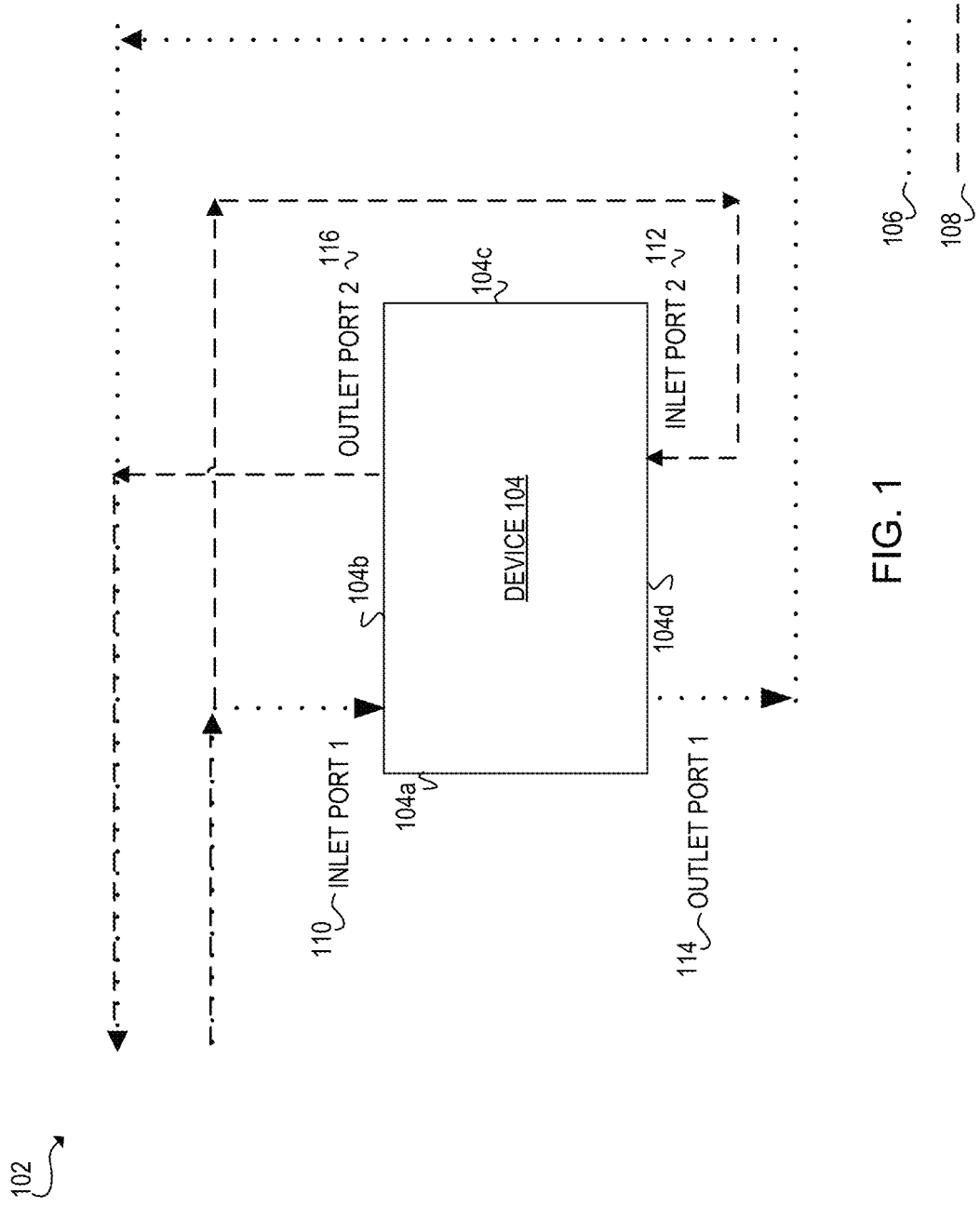
FIG. 1 illustrates an example cooling system to deliver a flow of a first cooling fluid and a second cooling fluid that flows in a direction opposite to the first cooling fluid across an electronic device in accordance with the present disclosure.

As global demand for data exchange grows so does the size and load placed on computing systems, such as an exascale computing system. As such, exascale computing systems generate exponentially more power thus producing more heat. As these computing systems generate more heat, efficiently cooling the electrical components within these systems has become a concern. For example, concerns may involve properly balancing the flow of cooling fluid to each server in the cooling system while also keeping the overall flow rate and pressure down (as a lower pressure and flow rates indicate lower power consumption). Additionally, exascale computing systems have tight thermal tolerances which means the overall computing system has a tight range of acceptable thermal temperatures which makes efficiently cooling that much more challenging. Several approaches have been implemented to provide cooling advances. Such approaches may utilize a series cooling fluid loops that provide a single cooling fluid line to each device, along with a line. In the series cooling approach, the single cooling fluid line delivers cooling fluid to each device, while the return line receives the heated fluid for expulsion. The series cooling fluid loop is inefficient as the cooling fluid lines have a higher pressure drop for a given flow rate. Further, the series cooling fluid approach creates an unbalanced thermal distribution as the components located downstream may receive preheated fluid. In another approach, a parallel cooling fluid approach delivers multiple cooling fluid streams to a heated device with common return lines; however, this approach is also inefficient as components located downstream also receive the preheated fluid and have higher pressure drops for the given flow rate.

The present disclosure provides an efficient cooling system comprising multiple distribution units that each direct a cooling fluid loop across a heated device. The different cooling fluid loops flow in opposite directions from one another ensuring that cooling fluid is directed to multiple sides of the heated device. Directing cooling fluid to multiple sides of the heated device thermally balances the heated device which efficiently cools the overall heated device. Additionally, directing cooling fluid in opposite directions prevents over-heated spots on the device that may lead to failures.

In another example of the present disclosure, the cooling system includes microchannels through which the cooling fluid passes through prior to entering other devices located down-stream. Including microchannels provides additional heat transfer and fluid control so that a fluid pump exerts less energy to maintain the constant flow rate within the cooling system.

The following detailed description refers to the accompanying drawings. Wherever possible, the same reference numbers are used in the drawings and the following description to refer to the same or similar parts. It is to be expressly understood, however, that the drawings are for the purpose of illustration and description only. While several examples are described in this document, modifications, adaptations, and other implementations are possible, and indeed desirable as the ability to handle model complexity that evolves with time is another one of the advantages of the disclosure. Accordingly, the following detailed description does not limit the disclosed examples. Instead, the proper scope of the disclosed examples may be defined by the appended claims.

The terminology used herein is for the purpose of describing particular embodiments only and is not intended to be limiting. As used herein, the singular forms "a," "an," and "the" are intended to include the plural forms as well, unless the context clearly indicates otherwise. The term "multiple," as used herein, is defined as two, or more than two. The term "another," as used herein, is defined as at least a second or more. The term "coupled," as used herein, is defined as connected, whether directly without any intervening elements or indirectly with at least one intervening elements, unless otherwise indicated. Two elements can be coupled mechanically, electrically, or communicatively linked through a communication channel, pathway, network, or system. The term "and/or" as used herein refers to and encompasses any and all possible combinations of one or more of the associated listed items. It will also be understood that, although the terms first, second, third, etc. may be used herein to describe various elements, these elements should not be limited by these terms, as these terms are only used to distinguish one element from another unless stated otherwise or the context indicates otherwise. As used herein, the term "includes" means includes but not limited to, the term "including" means including but not limited to. The term "based on" means based at least in part on.

The foregoing disclosure describes a number of example implementations for effectively cooling components in a computing environment. The disclosed examples may include systems, devices, computer-readable storage media, and methods for detecting the member suffering the soft failure. For purposes of explanation, certain examples are described with reference to the components illustrated in FIGS. 1-7. The functionality of the illustrated components may overlap, however, and may be present in a fewer or greater number of elements and components. Further, all or part of the functionality of illustrated elements may co-exist or be distributed among several geographically dispersed locations. Moreover, the disclosed examples may be implemented in various environments and are not limited to the illustrated examples.

FIG. 1 illustrates an example cooling system 102 that delivers first cooling fluid 106 and second cooling fluid 108 across device 104. First cooling fluid 106 is delivered to inlet port 110 while second cooling fluid is delivered to inlet port 112. Delivering cooling fluids 106 and 108 to inlet ports 110 and 112 means first cooling fluid 106 and second cooling fluid 108 flow in opposite directions to one another. Directing cooling fluids 106 and 108 in opposite directs allows cooling to be spread out across device 104 to prevent overheated spots. Rather, cooling system 102 provides a more uniform design to spread the cooling effect across device 104. Based on directing cooling fluids 106 and 108 across device 104, cooling fluids 106 and 108 are expelled at outlet ports 114 and 116. In this implementation, cooling fluids 106 and 108 are delivered on one distribution line, while the expulsion of cooling fluids 106 and 108 are delivered on a different distribution line. This implementation is illustrated and discussed in later figures. System 102 represents a cooling mechanism that cools device(s) 104 within a server and/or data center. As such, system 102 may further include manifolds, piping, lines, distribution components and other components not illustrated in FIG. 1 for carrying cooling fluids 106 and 108 across device 104.

Device 104 is an electrical component capable of producing heat. As such, cooling system 102 is designed to keep internal temperatures of device 104 and the overall system within an operational range. Device 104 includes sides 104a-104d used as a structure for the electrical component. In an implementation, cooling fluids 106 and 108 distribute across device 104 from opposite sides 104b and 104d. In this implementation, cooling fluids 106 and 108 are also expelled from opposite sides of one another. In another implementation, cooling system 102 effectively cools multiple devices that are in parallel and series to one another. Details over this implementation are illustrated in later figures. Although FIG. 1 illustrates cooling fluids 106 and 108 as flowing between sides 104b and 104d this was done for illustration purposes as cooling fluids may flow between sides 104a and 104c or combinations thereof. Further, device 104 may also include more than five sides 104a-104d. Implementations of device 104 include an electronic device, computing device, integrated circuit, semiconductor, memory module, central processing unit (CPU), processing resource, application-specific integrated circuit (ASIC), controller, processor, chipset, or other component capable of producing heat during operation.

First cooling fluid 106 and second cooling fluid 108 are liquids that are distributed to inlet ports 110 and 112 for cooling device 104. Based on being distributed to inlet ports 110 and 112, cooling fluids 106 and 108 are directed across device 104 to remove heat. Cooling fluids 106 and 108 are located in a parallel manner and flow in opposite directions to each other which allows a more efficient cooling of device 104. Additionally, this also allows a cooling fluid pump to exert less energy to maintain the flow of cooling fluids 106 and 108 across device 104. In an implementation, cooling fluids 106 and 108 comprise the same fluid flowing from the same distribution line to device 104. In another implementation, cooling fluids 106 may comprise different cooling fluids that flow from different distribution lines. Yet in a further implementation, cooling fluids 106 and 108 are in direct contact with device 104 such that cooling fluids 106 and 108 draw out the heat generated from device 104. Implementations of cooling fluids 106 and 108 include water, coolant, gas, liquid, or combinations thereof that are capable of flowing across device 104 to regulate the temperature of device 104. Additionally although FIG. 1 illustrates cooling fluids 106 and 108 with two different patterns, cooling fluids 106 and 108 may flow from the same distribution line to opposite sides 104b and 104d of device 104. Providing cooling fluids 106 and 108 in the same distribution line means first cooling fluid 106 and second cooling fluid 108 may be distributed in sequential order and/or simultaneously across device 104.

Inlet ports 110 and 112 represent mechanisms of entry for first cooling fluid 106 and second cooling fluid 108, respectively. Inlet ports 110 and 112 receive respective cooling fluids 106 and 108 for distribution across device 104. Inlet ports 110 and 112 may include a separate distribution line from cooling fluid main distribution line such that allows the free flow of cooling fluids 106 and 108 across device 104. Inlet ports 110 and 112 receive cooling fluids 106 and 108 from the distribution line that carries cooling fluids 106 and 108. As such, inlet ports 110 and 112 may be located on opposite sides of device 104. In one implementation, inlet ports 110 and 112 may include a valve that is automated by a controller (not illustrated) that manages the flow of cooling fluids 106 and 108 across device 104. Implementations of inlet ports 110 and 112 include pipes, ducts, lines, canals, passages, tubes, or vessels capable of distributing cooling fluids 106 and 108 into device 104.

Outlet ports 114 and 116 represents mechanisms of expulsion of cooling fluids 106 and 108 from device 104. Outlet ports 114 and 116 receive the cooling fluids 106 and 108 after each fluid 106 and 108 is directed across device 104. In this manner, outlet ports 114 and 116 may receive fluids that are heated from cooling device 104. In an implementation, outlet ports 114 and 116 may be located on opposite sides of device 104 and on the distribution line separate from cooling fluids 106 and 108. As such, this allows outlet ports 114 and 116 to carry the cooling fluids 106 and 108 away from system 102 to a thermal exchanger prior to coming back into the system 102 to cool device 104. Implementations of outlet ports 114 and 116 include pipes, ducts, lines, canals, passages, tubes, or vessels capable of expelling cooling fluids 106 and 108 from device 104.

Figure 2A:
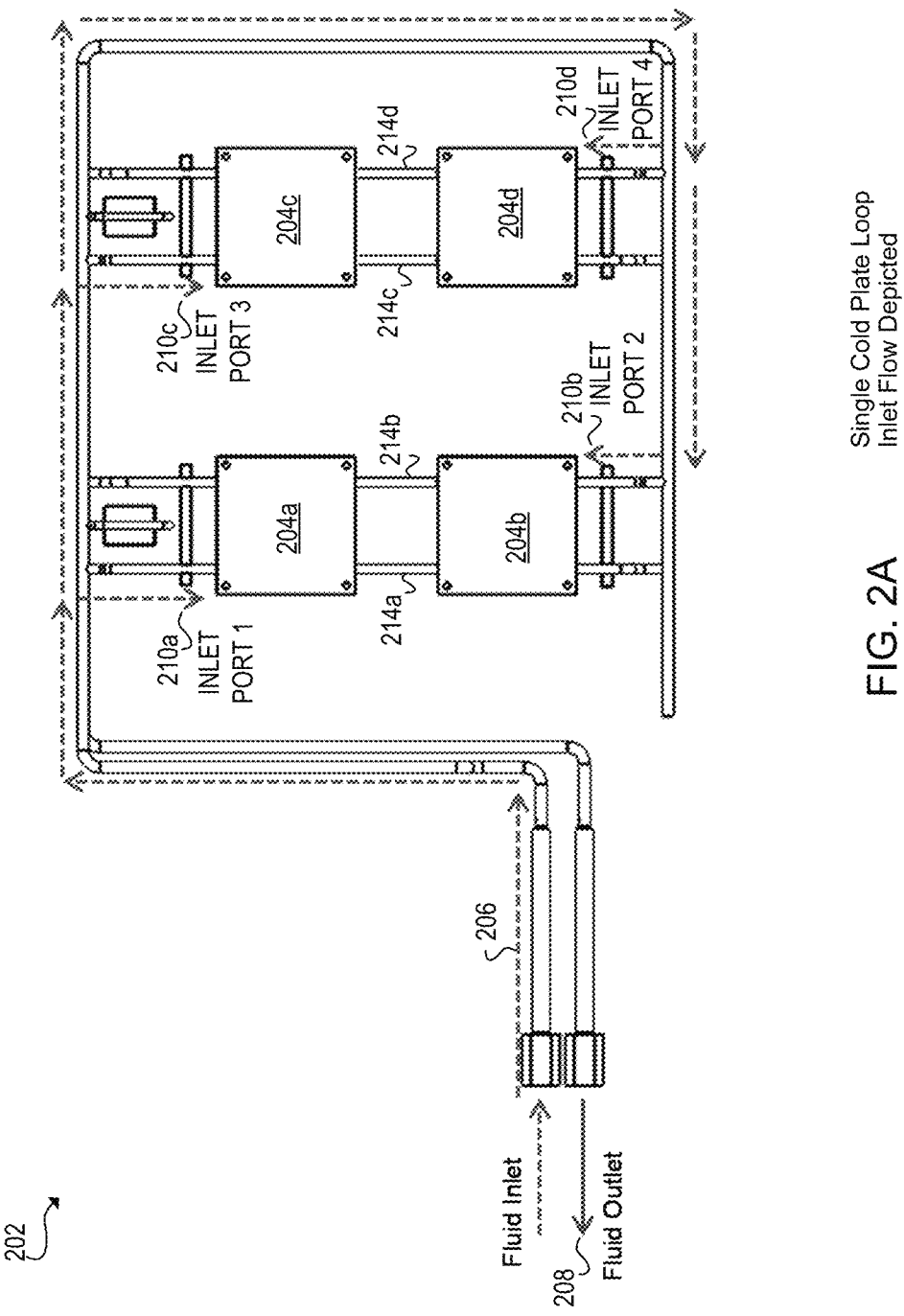
FIG. 2A represents an example cooling system that includes a first cooling fluid across multiple electronic devices and a second cooling fluid that flows opposite to the first cooling fluid in accordance with the present disclosure.

FIGS. 2A-2B illustrate cooling system 202 and directional flows of cooling fluids 206 and 208 across multiple devices 204a-204d. Specifically, FIG. 2A illustrates an inlet directional flow of first cooling fluid 206 while FIG. 2B illustrates an expulsion of fluid 208 from devices 204a-204d.

Turning now to FIG. 2A, cooling system 202 illustrates a directional flow of first cooling fluid 206 through multiple inlets 210a-210d and across multiple devices 204a-204d. Additionally, cooling system 202 includes the expulsion of fluid outlet 208. As illustrated, cooling fluid 206 enters the fluid inlet and is carried in a distribution line and distributed to various inlet ports 210a-210d. Each inlet 210a-210d receives cooling fluid 206 and directs it across each device 210a-210d. Each device 210a-210d includes multiple sides for entry of cooling fluid 206. In this example, each set of devices 204a-204b and 204c-204d are parallel to one another. This allows at least four different inlet ports 210a-210d to direct cooling fluid 206 across devices 204a-204d. Inlet ports 210a and 210c direct cooling fluid 206 from one direction across devices 204a-204d, while inlet ports 210b and 210d direct cooling fluid 206 in a direction opposite of inlet ports 210a and 210c. In this implementation, cooling fluid 206 enters a set of devices 204a and 204b and inlet ports 210a and 210b. For example, to cool a set of devices 204a and 204b, a first stream of cooling 206 enters 210a to direct the flow across initial device 204a while a second stream cooling fluid 206 also enters inlet port 210b to initially cool device 204b. In this example, the first stream initially cools device 204a and enters pre-heated stream 214a prior to cooling second device 204b and exiting at the outlet as illustrated in FIG. 2B. The second stream of cooling fluid 206 enters inlet port 210b to initially cool second device 204b and enters pre-heated stream 214b prior to cooling first device 204a and expulsion at the opposite side of the first device 204a. Taking the second set of devices 204c and 204d, a third stream of cooling fluid 206 enters inlet port 210c while a fourth stream of cooling fluid 206 enters inlet port 210d. The third stream is initially directed across third device 204c prior to entering pre-heated stream 214c and then fourth device 204d prior to expulsion at the outlet as illustrated in FIG. 2B. The fourth stream enters inlet port 210d and cools fourth device 204 initially then enters pre-heated stream 214d prior to cooling third device 204c and expulsion at the outlet as in FIG. 2B.

Turning now to FIG. 2B, cooling system 202 illustrates the expulsion of fluid 208 that are collected after directing across devices 204a-204d. Additionally, the cooling system includes cooling fluid 206 that is distributed across devices 204a-204d prior to expulsion at outlet ports 212a-212d. As illustrated in FIG. 2B, cooling fluid enters at fluid inlet 206 and distributed to inlet ports 210a-210d as in FIG. 2A for directing across devices 204a-204d. Additionally, cooling system 202 includes the expulsion of fluid outlet 208. As illustrated, cooling fluid 206 enters fluid inlet and is carried in a distribution line and distributed to various inlet ports 210a-210d. In this implementation, the expulsion of the fluid at outlet ports 212a-212d is carried out on a different distribution line separate from the cooling fluid 206 entry at inlet ports 210a-210d.

Walking through an example, take the first set of devices 204a-204b a first expulsion stream enters outlet port 212b and carried out on the distribution line, while a second expulsion stream enters outlet port 212a and carried out on the distribution line and away from cooling system 202 to the fluid outlet. Taking the second set of devices 204c-204d a third expulsion stream enters outlet port 212d and carried out on the distribution line away from cooling system 202 to the fluid outlet while a fourth expulsion stream enters outlet port 212c and carried out to the fluid outlet. In a further implementation, prior to the expulsion of the streams, cooling fluid 206 may pass through sets of microchannels. This implementation may be discussed in detail in later figure.

Figure 3B:
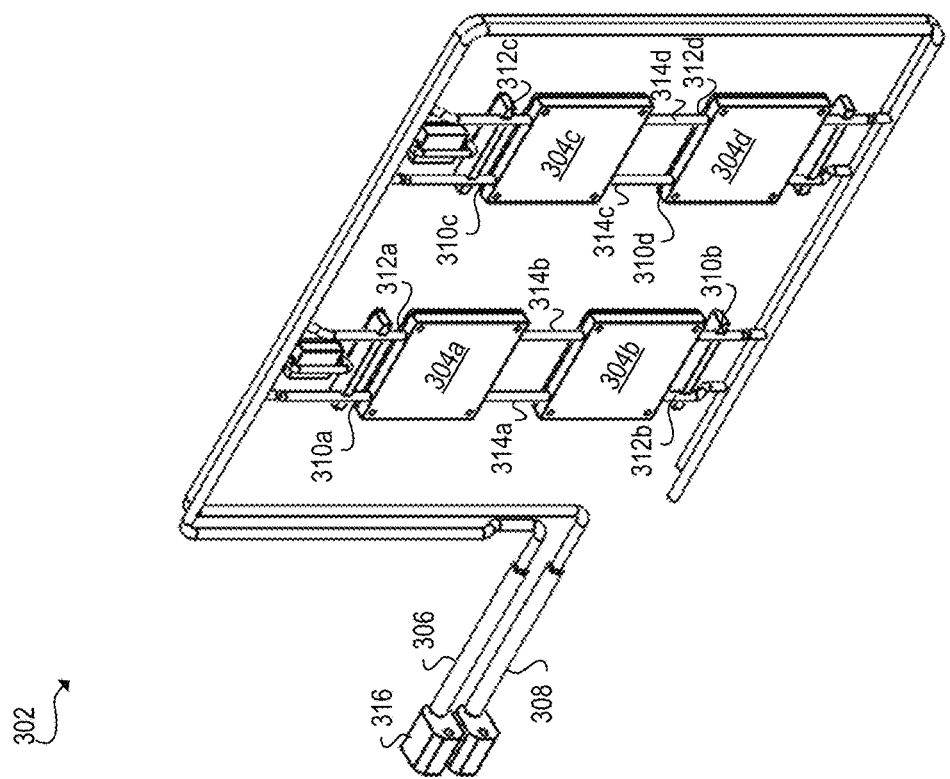
FIG. 3B illustrates an example cooling architecture with a cross-section of FIG. 3A that includes cooling fluid loops to deliver and expel cooling fluids from multiple electronic devices in accordance with the present disclosure.
Figure 3A:
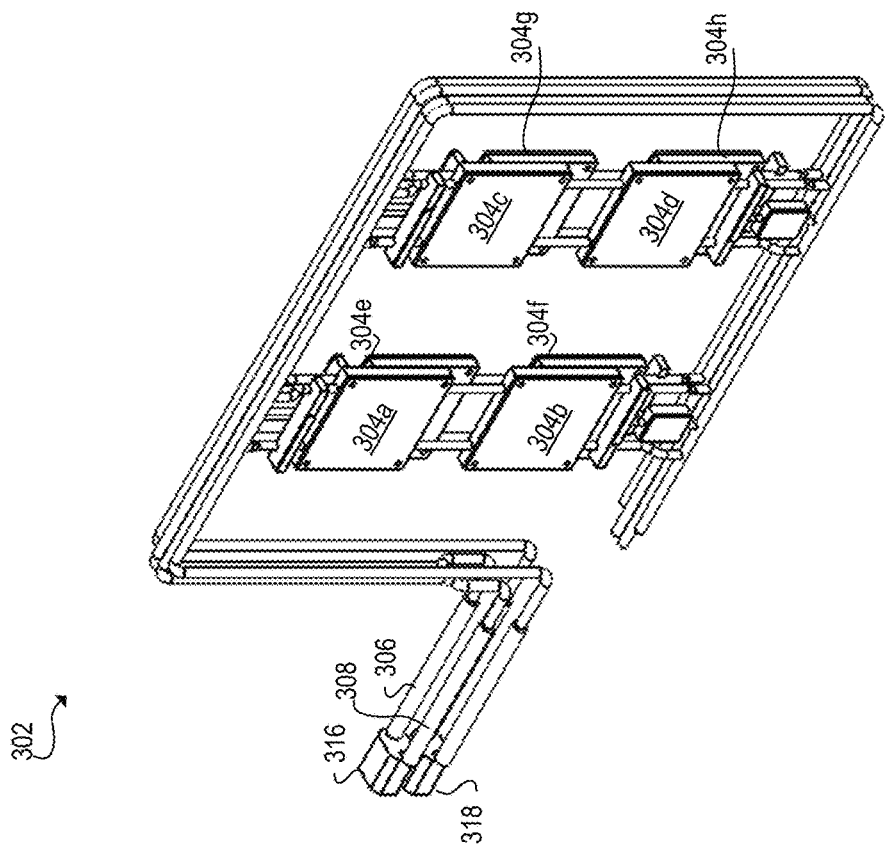
FIG. 3A illustrates an example cooling architecture with a double cooling system to deliver and expel cooling fluids from multiple electronic devices in accordance with the present disclosure.

FIGS. 3A-3B illustrate cooling architecture 302 including multiple distribution lines in which to deliver cooling fluid 306 and expulsion of fluid 308. Specifically, FIG. 3A illustrates a double cooling system that is stacked between multiple devices 304a-304h. FIG. 3B illustrates a cross-section perspective of the double cooling system in FIG. 3A. As such, FIG. 3B may also be considered a single cooling system at which to deliver and expel fluid to cool devices 304a-304d. Although FIGS. 3A-3B seem to orient directions of each component that comprises cooling architectures 302, implementations should not be so limited as this was done for illustration purposes. For example, devices 304e-304h may located at the front of FIGS. 3A-3B and/or distribution lines 306 and 308 located below the other distribution lines, etc.

Turning now to FIG. 3A, example cooling architecture 302 includes a double cooling system to deliver and expel cooling fluids from devices 304a-304h. Cooling architecture includes connectors 316 and 318 that couple respective distribution lines to deliver and expel fluid from devices 304a-304h. For example, connector 316 couples distribution line 306 that delivers a flow of cooling fluid to respective devices 304a-304d and distribution line 308 that expels fluid from the cooling architecture. Connector 318 couples two different distribution lines that are located underneath distribution lines 306 and 308. Accordingly, these two different distribution lines carry cooling fluid to devices 304e-304h and expel fluid from these devices 304e-304h. Connectors 316 and 318 couple distribution lines together so that cooling fluid is carried to devices 304a-304h and expelled from devices 304a-304h. As such, connectors 316 and 318 may include tubing and/or fittings to a thermal heat exchanger and manifold. Connectors 316 and 318 provide the connections between the respective distribution lines to the manifold and heat exchanger. Connectors 316 and 318 include a mechanical component that couples together distribution cooling lines and as such may include tubing, linings, passages, vessels, structure, or other types of mechanical components that couple together distribution lines in cooling architecture 302.

Turning now to FIG. 3B, example cooling architecture 302 illustrates the cross sectional perspective of FIG. 3A. In FIG. 3B, cooling architecture 302 includes a single cooling system and cooling distribution loops 306 and 308 in which to deliver and expel cooling fluids from devices 304a-304d. Distribution line (e.g., loop) 306 delivers cooling fluids to inlets 310a-310d around the cooling system to deliver a flow of fluid across devices 304a-304d. Pre-heated streams 314a-314d represent the flow of cooling fluid between devices 304a-304b and 304c-304d prior to entering the next device to cool. As such, upon cooling devices 304a-304d, fluid is then received at outlet ports 312a-312d and carried out at distribution line (e.g., loop) 308 away from the cooling system. As discussed in connection with earlier figures, devices 304a-304d, inlet ports 310a-310d, outlet ports 312a-312d, and pre-heated streams 314a-314d are similar in functionality to devices 204a-204d, inlet ports 210a-210d, outlet ports 212a-212d, and pre-heated streams 214a-214d as in FIGS. 2A-2B.

Figure 4:
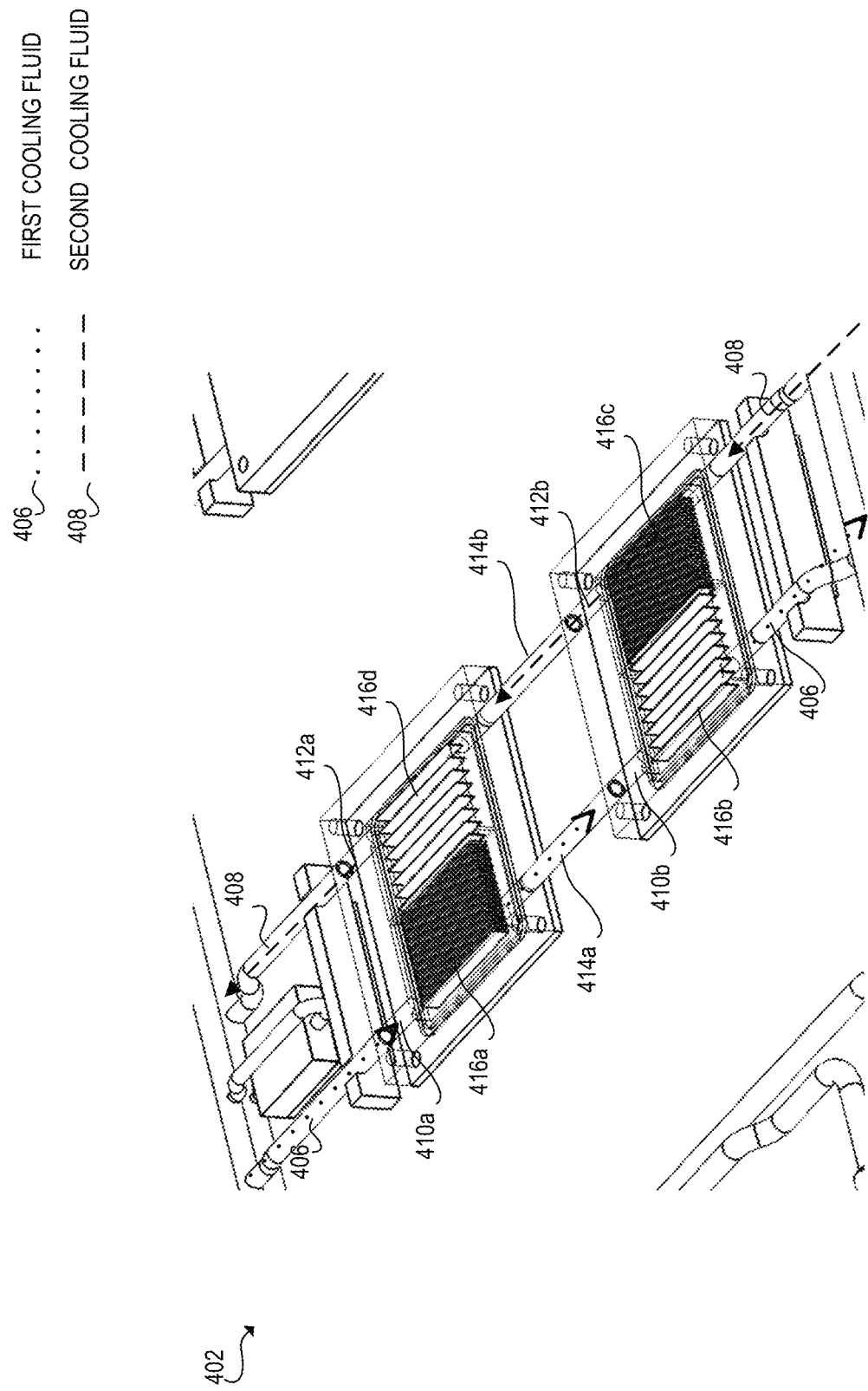
FIG. 4 illustrates an example cooling system with a set of microchannels through which cooling fluid passes in accordance with the present disclosure.

FIG. 4 illustrates cooling system 402 including sets of microchannels 416a-416d positioned on top of multiple devices. Each set of microchannels 416*a*-416*d* include multiple divided channels through which cooling fluid passes through prior to cooling the next device. Cooling fluids 406 and 408, inlet ports 410*a*-410*d*, outlet ports 412*a*-412*d*, and pre-heated streams 414*a*-414*d* are similar in functionality to inlet ports 210*a*-210*d*, outlet ports 212*a*-212*d*, and pre-heated streams 214*a*-214*d* as in FIGS. 2A-2B.

In this figure, cooling fluids 406 and 408 each enter inlet ports 410*a* and 410*b* and passes through sets of microchannels 416*a* and 416*c*. After passing through sets of microchannels 416*a* and 416*c*, each cooling fluid stream 406 and 408 enters pre-heated stream 414*a* and 414*b* prior to entering additional sets of microchannels 416*b* and 416*d*, respectively. As such, each stream of cooling fluid 406 and 408 is expelled at outlet ports (not illustrated). Each set of microchannels 416*a*-416*d* represent a set of microtechnology channels used in fluid control and heat transfer. As such, heat may be evenly distributed across the devices (not illustrated) under sets of microchannels 416*a*-416*d*. Using four different sets of microchannels 416*a*-416*d* creates a much more efficient control of cooling fluids 406 and 408 which means a fluid pump (not illustrated) exerts less energy maintaining a pressure among cooling fluids 406 and 408 within cooling system 402. In one implementation, each set of microchannels 416*a*-416*d* include a same number of divided channels through which cooling fluids 406 and 408 pass through, while in another implementation, each set of microchannels 416*a*-416*d* include a different number of divided channels.

Figure 5:
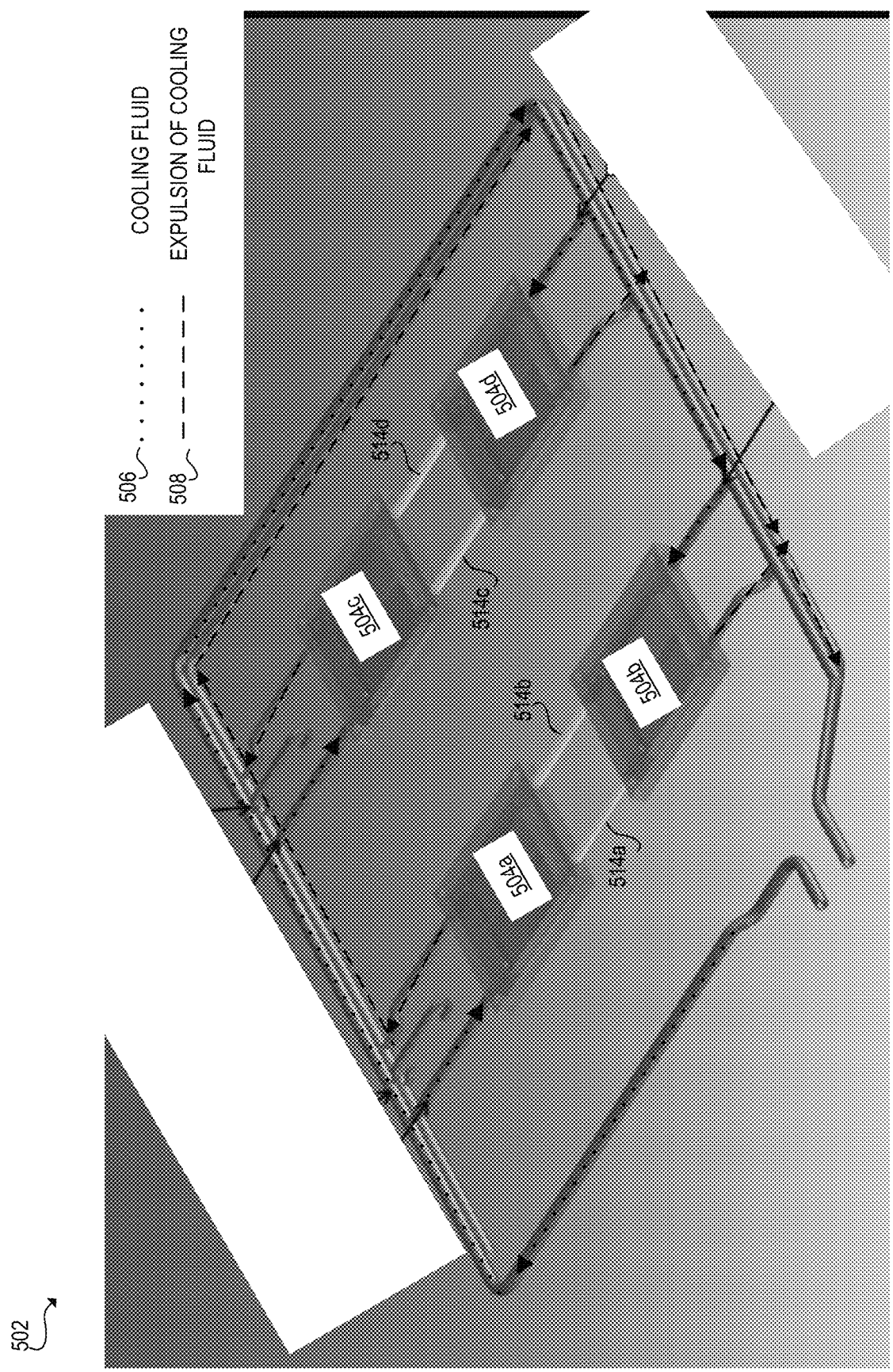
FIG. 5 is an example cooling system architecture that includes cooling fluids flowing in opposite directions across multiple electronic devices in accordance with the present disclosure.

FIG. 5 provides another perspective of cooling system 502 that includes cooling fluid 506 that enters inlet ports (not illustrated) distributed across multiple devices 504*a*-504*d*. Expulsion of cooling fluid 508 occurs at outlet ports (not illustrated) and carried out away from cooling system 502. In this figure, streams of cooling fluids 506 flow in opposite directions of one another across each device 504*a*-504*d*. For example consider first device 504*a* and second device 504*b*, cooling fluid 506 enters from the top of first device 504*a* and bottom of second device 504*b*. Upon flowing over each device 504*a* and 504*b*, each stream of cooling fluid 506 enters pre-heated stream 514*a*-514*b*. From pre-heated streams 514*a*-514*b*, streams then flow across the other device it entered and is then expelled as indicated by expulsion of cooling fluid 508. In this example, each stream of cooling fluid 506 flows opposite or counter to one another such that a stream of cooling fluid enters from the top of each device and the bottom of each device. In another example, consider third device 504*c* and fourth device 504*d*, cooling fluid 506 enters from the top of third device 504*c* and bottom of second device 504*d* prior to entering pre-heated streams 514*c*-514*d*. Directing the streams from the top of third device 504*c* and bottom of fourth device 504*d* means the streams of cooling fluid 506 flow in a counter direction to one another across each of these devices 504*c*-504*d*. This provides a more efficient mechanism to cool these devices to prevent heat spots that may cause failure(s) of the devices. Devices 504*a*-504*d* are similar in functionality to devices 204*a*-204*d* and 304*a*-304*d* as in FIGS. 2A-2B and FIGS. 3A-3B. Pre-heated streams 514*a*-514*d* are similar in functionality to pre-heated streams 214*a*-214*d* and 314*a*-314*d* as in FIGS. 2A-2B and FIGS. 3A-3B.

Figure 6:
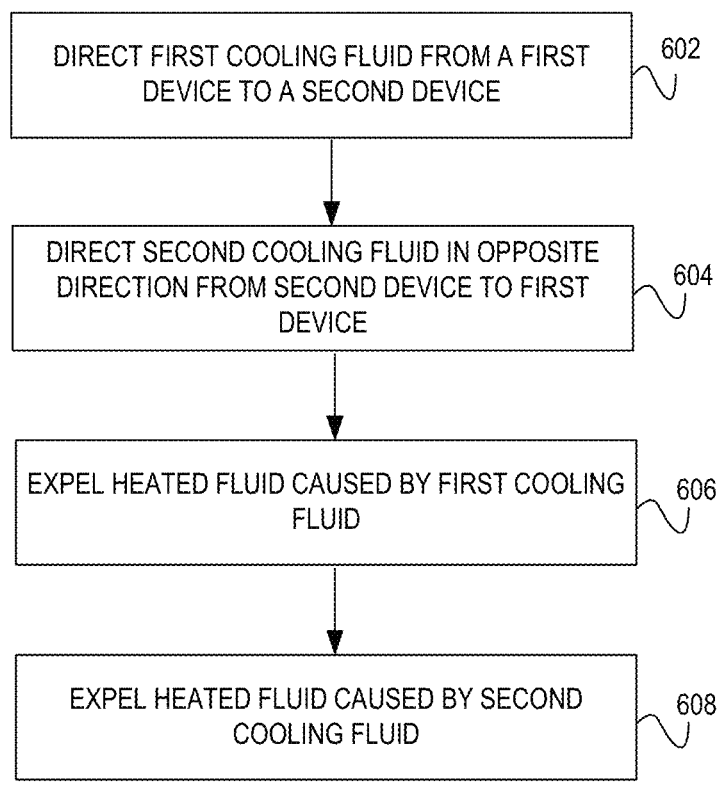
FIG. 6 illustrates a flow diagram executable by a computing device to direct a first cooling fluid and a second cooling fluid across multiple electrical devices in accordance with the present disclosure.

Referring now to FIGS. 6 and 7, flow diagrams are illustrated in accordance with various examples of the present disclosure. The flow diagrams represent processes that may be utilized in conjunction with various systems and devices as discussed with reference to the preceding figures. While illustrated in a particular order, the flow diagrams are not intended to be so limited. Rather, it is expressly contemplated that various processes may occur in different orders and/or simultaneously with other processes than those illustrated. As such, the sequence of operations described in connection with FIGS. 6-7 are examples and are not intended to be limiting. Additional or fewer operations or combinations of operations may be used or may vary without departing from the scope of the disclosed examples. Thus, the present disclosure merely sets forth possible examples of implementations, and many variations and modifications may be made to the described examples.

FIG. 6 illustrates a flow diagram executable by a computing device to effectively cool a computing system by distributing cooling fluids and expelling the fluids from the computing system. In discussing FIG. 6, references may be made to the components in FIGS. 1-5 to provide contextual examples. In one implementation, cooling system 102 and 202 FIGS. 1-2 executions 602-608 to provide cooling fluids and expels the fluids from the system. In another implementation, a processing resource (not illustrated) executes operations 602-608. Although FIG. 6 is described as implemented by the computing system 102 and 202 as in FIGS. 1-2 to effectively cool a computing system, it may be executable on other suitable hardware components. For example, FIG. 6 may be implemented in the form of executable instructions on a machine-readable storage medium executable by processing resources to provide the functionality of operations 602-608.

At operation 602, the cooling system directs the first cooling fluid from a first electronic device to a second electronic device. In this operation, the first cooling fluid is directed in series from the first electronic device to the second device. Alternatively, the first cooling fluid flows in a sequential order form the first electronic device to the second electronic device. In this implementation, the first cooling fluid is initially directed to the first electronic device downstream to the second electronic device. In another implementation, the first cooling fluid flows in a distribution line across the device as such a manifold may be coupled to the distribution line that accepts the cooling fluid prior to distribution across the first electronic device and then the second electronic device. The cooling system may proceed to direct a second cooling fluid that flows in an opposite direction to the first cooling fluid as at operation 604.

At operation 604, the cooling system directs a second cooling fluid that is separate from the first cooling fluid discussed at operation 602. The cooling system directs a flow of the second cooling fluid in a direction opposite the flow of the first cooling fluid. The second cooling fluid flows from across the second device to across the first device. Alternatively, the second cooling fluid flows in a sequential order from the second device to the first device.

At operations 608-610, the cooling system expels the first cooling fluid at the second device and the second cooling fluid at the first device. In an implementation, the expulsion of both the first cooling fluid and the second cooling fluid occurs on one distribution line while the entrance of the both the first cooling fluid and the second cooling fluid occurs on a different distribution line. In this implementation, performing the entrance and expulsion of the cooling fluids on different distribution lines enables the cooling system to maintain pressure equilibrium. In another implementation, another set of distribution lines cooling two different electronic devices in parallel to the first and second electronic device. In this implementation, since the distribution lines are set up in parallel to one another, this means there is a lower pressure drop and the cooling fluid pump consumes minimal power to maintain the flow rate of the cooling fluids. In a further implementation, sets of microchannels are located in between the electronic devices such that each respective cooling fluid flows through each respective set of microchannels. Each respective set of microchannels allows the respective cooling fluid to spread out across the channels from which heat may be additionally pulled out prior to reach the next electronic device. This implementation may be discussed in detail in the next figure.

In an alternative of operations 606-608, the expulsion of each cooling fluid is in the location prior to the entrance of the cooling fluid. Meaning, the first cooling fluid that enters the system to cooling the device is expelled in the location opposite to the entrance. For example, since the first cooling fluid enters at the first electronic device, the first cooling fluid is expelled at a side of the second electronic device that is opposite to the entrance of the first cooling fluid. In another example, since the second cooling fluid enters at the second electronic device, the second cooling fluid is expelled at the side of the first device opposite to the entrance of the second electronic device. The flow of each of the cooling fluids was discussed in detail in previous figures.

FIG. 7 illustrates a flow diagram executable by a computing device to effectively cool a computing system by distributing cooling fluids and expelling the fluids from the computing system. In discussing FIG. 7, references may be made to the components in FIGS. 1-5 to provide contextual examples. In one implementation, cooling system 102 and 202 FIGS. 1-2 executions 702-716 to provide cooling fluids and expels the fluids from the system. In another implementation, a processing resource (not illustrated) executes operations 702-716. Although FIG. 7 is described as implemented by the computing system 102 and 202 as in FIGS. 1-2 to effectively cool a computing system, it may be executable on other suitable hardware components. For example, FIG. 7 may be implemented in the form of executable instructions on a machine-readable storage medium executable by a processing resources to provide the functionality of operations 702-716.

At operation 702, the cooling system directs a flow of a first cooling fluid from a first electronic device to a second electronic device. Directing the flow of the first cooling fluid includes distributing the first cooling fluid in a distribution line. In one implementation, operation 702 is performed simultaneously to operation 704. Operation 702 is similar in functionality to operation 602 as in FIG. 6.

At operation 704, the cooling system directs a flow of a second cooling fluid from the second electronic device to the first electronic device. The flow of the second cooling fluid is an opposite direction to the first cooling fluid. In this implementation, the flow of the first cooling fluid is parallel to the flow of the second cooling fluid. The parallel design of the flow of the cooling fluids provides a lower pressure drop which means the fluid pump operates more efficiently. Operation 704 is similar in functionality to operation 604 as in FIG. 6.

At operation 706, the cooling system directs the first cooling fluid from the first device to a second device. By directing to the second device, the first cooling fluid may enter a set of microchannels that allows the heat to spread evenly across the first device such that fluid flows into multiple microtechnology channels within the set. This provides additional fluid control that means the fluid pump exerts less energy to maintain the pressure within the cooling system. The first cooling fluid may reach a set of microchannels prior to flowing to other devices as at operations 710-712.

At operation 708, the cooling system directs the second cooling fluid from the second device to a second set of microchannels that is different from the first set of microchannels as at operation 706. In this operation, the cooling system may direct the second cooling fluid to the second set of microchannels simultaneously as directing the first cooling fluid through the first set of microchannels.

At operations 710-712, the cooling system proceeds to direct the cooling fluid through a third and fourth set of microchannels prior to expulsion of the cooling fluid from the cooling system. Specifically, the first cooling fluid is directed to a third set of microchannels while the second cooling fluid is directed to a fourth set of microchannels. As explained in connection with earlier figures, the sets of microchannels provides an additional efficiency mechanism that allows for additional cooling as the cooling fluid passes through.

At operation 714, the cooling system expels the first cooling fluid at the second electronic device. In this operation, the expulsion of first cooling fluid occurs once the fluid has already crossed by the first electronic device and the second electronic device. Operation 714 is similar in functionality to operation 606 as in FIG. 6.

At operation 716, the cooling system expels the second cooling fluid at the first electronic device. In this operation, the expulsion of the second cooling fluid occurs once the fluid has cooled, in sequential order from the second electronic device to the first electronic device. Operation 716 is similar in functionality to operation 608 as in FIG. 6.

Although certain embodiments have been illustrated and described herein, it will be appreciated by those of ordinary skill in the art that a wide variety of alternate and/or equivalent embodiments or implementations calculated to achieve the same purposes may be substituted for the embodiments shown and described without departing from the scope of this disclosure. Those with skill in the art will readily appreciate that embodiments may be implemented in a variety of ways. This application is intended to cover adaptions or variations of the embodiments discussed herein. Therefore, it is manifestly intended that embodiments be limited only by the claims and equivalents thereof.

We claim:

1. An electronic device cooling system for a plurality of devices including a first device and a second device, the electronic device cooling system comprising:
    a first distribution line that:
        delivers a first cooling fluid across a first device from a first side of the first device to a second side of the first device;
    a second distribution line, separate from the first distribution line, that:
        delivers a second cooling fluid, separate from the first cooling fluid, across the first device from the second side to the first side such that the second cooling fluid flows in an opposite direction to the first cooling fluid;
    a first set of microchannels through which the first cooling fluid flows from the first device to the second device; and
    a second set of microchannels in which the second cooling fluid flows from the second device to the first device.

2. The electronic device cooling system of claim 1 wherein the first distribution line expels heated fluid from the second side of the first device.

3. The electronic device cooling system of claim 2 wherein the second distribution line expels heated fluid from the first side of the first device.

4. The electronic device cooling system of claim 1 comprising:
a cooling plate, coupled to the first distribution line and the second distribution line, that transfers heat from the first cooling fluid and the second cooling fluid, the heat having previously been transferred from the first device to the first cooling fluid and the second cooling fluid.

5. The electronic device cooling system of claim 1 wherein the first distribution line and the second distribution line are parallel to one another.

6. The electronic device cooling system of claim 1 comprising:
a fluid coupler coupled to both the first distribution line and the second distribution line; and
a manifold coupled to the fluid coupler that:
distributes the first cooling fluid to the first distribution line and the second cooling fluid to the second distribution line prior to cooling the first device.

7. An electronic device cooling system comprising:
a first set of microchannels in which a first cooling fluid flows through from a first electronic device to a second electronic device;
a second set of microchannels in which a second cooling fluid flows from the second electronic device to the first electronic device;
a first cooling loop, separate from a second cooling loop, that:
provides a first cooling fluid in series from the first electronic device across to the second electronic device;
expels the first cooling fluid from the second electronic device;
the second cooling loop, separate from the first cooling loop that:
provides a second cooling fluid in series across the second electronic device to the first electronic device;
directs the second cooling fluid in a direction opposite to the direction of the first cooling fluid; and
expels the second cooling fluid from the first electronic device.

8. The electronic device cooling system of claim 7 wherein:
the first cooling loop comprises:
an inlet that provides the first cooling fluid across the first electronic device prior to the second electronic device; and
an outlet that expels the first cooling fluid from the second electronic device; and
the second cooling loop, separate from the first cooling loop, comprises:
a different inlet that provides the second cooling fluid across the second electronic device prior to the first electronic device; and
a different outlet that expels the second cooling fluid from the first electronic device.

9. The electronic device cooling system of claim 7 wherein the first cooling loop and the second cooling loop are parallel to one another.

10. The electronic device cooling system of claim 7 comprising:
a cold plate coupled to the first cooling loop and the second cooling loop.

11. The cooling system of claim 7 wherein the first cooling fluid and the second cooling fluid are in direct contact with the first electronic device and the second electronic device.

12. The electronic device cooling system of claim 7 wherein a third electronic device and a fourth electronic device are parallel to the first electronic device and the second electronic device and further wherein:
the first cooling loop delivers the first cooling fluid in series across the third electronic device to the fourth electronic device; and
the second cooling loop delivers the second cooling fluid in series across the fourth electronic device to the third electronic device.

13. A method, executable by a computing device, the method comprising:
directing a first cooling fluid in series from a first electronic device to a second electronic device;
directing a second cooling fluid, that flows in an opposite direction from the first cooling fluid, in series from the second electronic device to the first electronic device; and
expelling a first preheated fluid from the second electronic device; and
expelling a second preheated fluid from the first electronic device;
wherein the first and second electronic devices comprise:
a first set of microchannels in which the first cooling fluid flows from the first electronic device to the second electronic device and
a second set of microchannels in which the second cooling fluid flows from the second electronic device to the first electronic device.

14. The method of claim 13 wherein both the first cooling fluid and the second cooling fluid are in direct contact with the first electronic device and the second electronic device.

15. The method of claim 13 comprising:
directing the first cooling fluid from the first electronic device through the first set of microchannels prior to reaching the second electronic device; and
directing the second cooling fluid from the second electronic device through the second set of microchannels prior to reaching the first electronic device.

16. The method of claim 15 comprising:
directing the first cooling fluid into a third set of microchannels prior to expulsion at the second electronic device;
directing the second cooling fluid into a fourth set of microchannels prior to expulsion at the first electronic device.

17. The method of claim 16 comprising:
using multiple cold plates to create a single phase cooling system between the cooling fluids.

18. The method of claim 13 wherein the expulsion of the first preheated fluid and the second preheated fluid are carried out on one distribution line and further wherein the first cooling fluid and the second cooling fluid are carried in on a different distribution line.

19. The electronic device cooling system of claim 1 further comprising a third and fourth set of microchannels prior to expulsion of the cooling fluid from the cooling system, wherein the first cooling fluid is directed to a third set of microchannels and the second cooling fluid is directed to a fourth set of microchannels.

* * * * *